(12) United States Patent
Ukil et al.

(10) Patent No.: US 9,366,715 B2
(45) Date of Patent: Jun. 14, 2016

(54) FAULT DIRECTION PARAMETER INDICATOR DEVICE AND RELATED METHODS

(71) Applicant: ABB RESEARCH LTD, Zürich (CH)

(72) Inventors: Abhisek Ukil, Baden (CH); Bernhard Deck, Weilheim (DE); Vishal H. Shah, Vadodara (IN)

(73) Assignee: ABB Research Ltd., Zurich (CH)

( * ) Notice: Subject to any disclaimer, the term of this patent is extended or adjusted under 35 U.S.C. 154(b) by 455 days.

(21) Appl. No.: 13/861,840

(22) Filed: Apr. 12, 2013

(65) Prior Publication Data

US 2013/0221977 A1 Aug. 29, 2013

Related U.S. Application Data

(63) Continuation of application No. PCT/EP2011/067995, filed on Oct. 14, 2011.

(30) Foreign Application Priority Data

Oct. 14, 2010 (EP) .................................... 10187546

(51) Int. Cl.
*G01R 31/08* (2006.01)
*H02H 3/08* (2006.01)
(Continued)

(52) U.S. Cl.
CPC ............... *G01R 31/08* (2013.01); *H02H 3/081* (2013.01); *H02H 3/265* (2013.01); *G01R 19/0092* (2013.01); *G01R 31/025* (2013.01); *G01R 31/085* (2013.01)

(58) Field of Classification Search
CPC .... G01R 31/08; G01R 31/081; G01R 31/083; G01R 31/085; G01R 31/086; G01R 19/0092; G01R 31/25

See application file for complete search history.

(56) References Cited

U.S. PATENT DOCUMENTS

| 3,758,763 A | 9/1973 | Nohara et al. |
| 5,734,575 A * | 3/1998 | Snow ................... G01R 31/025 361/92 |

(Continued)

FOREIGN PATENT DOCUMENTS

DE 198 35 731 A1 2/2000

OTHER PUBLICATIONS

Eissa, Moustafa M., "Evaluation of a New Current Directional Protection Technique Using Field Data" IEEE Transactions on Power Delivery, vol. 20, No. 2, Apr. 2005, pp. 566-572, Cairo, Egypt.

(Continued)

*Primary Examiner* — Tung X Nguyen
*Assistant Examiner* — Adam Clarke
(74) *Attorney, Agent, or Firm* — Taft Stettinius & Hollister LLP

(57) ABSTRACT

A method of determining a fault direction parameter of a fault on an AC transmission line of a power distribution system relative to a measurement location of the transmission line. The method includes measuring a time-dependent AC current of the transmission line at the measurement location to obtain time-domain current data indicative of the measured current, obtaining a time of the fault on the transmission line, identifying first and second times by identifying a periodically re-occurring feature of the current data, such that the fault time is between the first and second times, extracting, from the current data, an offset indicative parameter indicative of a time offset of the current at the fault time and between the first and second times, calculating an offset direction parameter by comparing the offset indicative parameter to a non-offset indicative parameter, and establishing the fault direction parameter based on the offset direction parameter.

24 Claims, 6 Drawing Sheets

(51) Int. Cl.
*H02H 3/26* (2006.01)
*G01R 19/00* (2006.01)
*G01R 31/02* (2006.01)

(56) References Cited

U.S. PATENT DOCUMENTS

| | | | |
|---|---|---|---|
| 7,355,412 B1 | 4/2008 | Cannon | |
| 2004/0189317 A1* | 9/2004 | Borchert et al. | 324/512 |
| 2009/0009180 A1* | 1/2009 | Varghai et al. | 324/521 |
| 2009/0088989 A1* | 4/2009 | Guzman-Casillas | G01R 31/088 702/58 |
| 2010/0244851 A1* | 9/2010 | Akke et al. | 324/522 |
| 2011/0208449 A1* | 8/2011 | Dong et al. | 702/58 |

OTHER PUBLICATIONS

Pradhan, A.K., "Fault Direction Estimation in Radial Distribution System Using Phase Change in Sequence Current", IEEE Transactions on Power Delivery, vol. 22, No. 4, Oct. 2007, pp. 2065-2071, Kharagpur, India.

Ukil, Abhisek., et al. "Smart Distribution Protection Using Current-Only Directional Overcurrent Relay", IEEE PESConf. Innov. Smart Grid Technol. (ISGT Europe), 2010.

Notification Concerning Transmittal of International Preliminary Report on Patentability (Forms PCT/IB/326 and PCT/IB/373) and the Written Opinion of the International Searching Authority (Form PCT/ISA/237) dated Apr. 25, 2013, issued in corresponding International Application No. PCT/EP2011/067995. (10 pgs).

International Search Report (PCT/ISA/210) issued on Jan. 20, 2012, by the European Patent Office as the International Searching Authority for International Application No. PCT/EP2011/067995.

Written Opinion (PCT/ISA/237) issued on Jan. 20, 2012, by the European Patent Office as the International Searching Authority for International Application No. PCT/EP2011/067995.

* cited by examiner

FAULT DIRECTION PARAMETER INDICATOR DEVICE AND RELATED METHODS

RELATED APPLICATIONS

This application claims priority as a continuation application under 35 U.S.C. §120 to PCT/EP2011/067995, which was filed as an International Application on Oct. 14, 2011 designating the U.S., and which claims priority to European Application 10187546.6 filed in Europe Oct. 14, 2010. The entire contents of these applications are hereby incorporated by reference in their entireties.

FIELD

The present disclosure relates to a fault direction parameter indicator device for a power distribution system. More particularly, the present disclosure relates to a fault direction parameter indicator device for indicating a direction parameter of a fault on a transmission line. The present disclosure also relates to a directional overcurrent relay including such a fault direction parameter indicator device and a circuit breaker. In addition, the present disclosure relates to methods of determining a fault direction parameter of a fault on a transmission line of a power distribution system.

BACKGROUND INFORMATION

Directional overcurrent relays are widely used for the protection of power distribution systems such as radial and ring sub-transmission systems and other distribution systems. These relays have a functionality enabling them to determine a fault direction. Here, a fault generally means an overcurrent, such as from a short circuit. Further, the fault direction is in most cases binary information, indicating whether the fault is a forward fault or a backward fault. In a power line connecting an upstream power source to a downstream power distribution system portion (with the normal power direction from upstream to downstream), the forward direction is downstream of the relay, and the backward, or reverse, direction is upstream of the relay.

In smart grids, decentralized or distributed units can feed power into the grid or consume power from the grid. Thus, in smart grids, the power flow direction can change with time. In this situation, "forward" and "reverse" can still be defined as above with respect to the current power flow, so that, for example, the forward direction will change if the power flow is reversed.

More generally, the fault direction is an indicator at which side of a measurement location the fault has occurred. In the above example, there are two directions, forward and backward. If the measurement location is at a node of the power network having more than two sides, there can be more than just a forward or a backward direction. For example, for a node to which one backward line portion and two forward line portions are connected, the fault direction can include the cases "forward-1", "forward-2", and "backward".

The directional information provides more detailed information about the location at which a fault has occurred. This information can be used to deactivate a smaller portion of the power distribution system in the case of a fault. For example, a known ring-main feeder (e.g. for domestic supplies) has breakers at its T-junctions. If there is a fault in any of the lines of this ring-main feeder, the whole line section may be interrupted. This situation can be improved when more detailed fault directional information is obtained. For this purpose, directional overcurrent relays can be installed in the line along with breaking switches. With such a relay-switch system, a reference voltage measurement allows for the computation of the fault current and its direction. The directional information can then be used to disconnect only the appropriate section, rather than the whole line.

Known directional overcurrent relays rely on a reference voltage phasor, also known as "voltage polarization", for estimating the direction of the fault. When a fault occurs, the fault current has a characteristic phase angle relative to the voltage phasor, where the phase angle depends on the fault direction. The fault direction is determined by comparing the current phasor (complex current value whose real part is the actual AC current) to a reference voltage phasor (industrially termed as 'voltage polarization') measured at a measurement location on the power line. This requires measurement of both current and voltage. This approach becomes unreliable when the fault is in close proximity to the relay, because in this case, the relay is almost grounded by the short circuit (industrially termed as 'close-in faults').

Further, overcurrent relays including a voltage measurement unit are expensive. Since they have to be used in large number for the above arrangement, this is a major cost factor.

In "Fault Direction Estimation in Radial Distribution System Using Phase Change in Sequence Current" of Pradhan A. K. ET AL, IEEE TRANSACTIONS ON POWER DELIVERY, IEEE SERVICE CENTER, New York, N.Y., US, vol. 22, no. 4, 1 Oct. 2007 (2007-10-01), pages 2065-2071, XP011191870, ISSN:0885-8977, DOI:10.1109/TP-WRD.2007.905340, a fault direction estimation is proposed based on a phasor estimation. Time-domain current data indicative of the measured current are not obtained.

DE 19835731A1 discloses an experimental setup for fault direction estimation analyzing the phase angle between current and voltage in an electrical grid.

In "Evaluation of a New Current Directional Protection Technique Using Field Data" of Eissa M. M., IEEE TRANSACTIONS ON POWER DELIVERY, IEEE SERVICE CENTER, New York, N.Y., US, vol. 20, no. 2, 1 Apr. 2005 (2005-04-01), pages 566-572, XP011129251, ISSN: 0885-8977, D01:10.1109/WRD.2005.844356, the difference in phase relationship created by a fault is exploited by making relays which respond to phase angle difference between two quantities—such as the fault current and the prefault current.

SUMMARY

An exemplary embodiment of the present disclosure provides a method of determining a fault direction parameter of a fault on an AC transmission line of a power distribution system relative to a measurement location of the transmission line. The exemplary method includes measuring, by a measurement unit, a time-dependent AC current of the transmission line at the measurement location to obtain time-domain current data indicative of the measured current. The measurement unit includes a current sensor for measuring the current at the measurement location of the transmission line but does not include a voltage sensor. The exemplary method also includes transmitting the current data from the measurement unit to a decision logic section, obtaining a fault time of the fault on the AC transmission line, and identifying a first time and a second time by identifying a periodically re-occurring feature of the current data, such that the fault time is between the first time and the second time. The periodically re-occurring feature is selected from the group consisting of a zero-crossing, a maximum, a minimum, and a highest gradient of the current data. The exemplary method also includes extracting, from the current data, an offset indicative parameter indicative of a time offset of the current at the fault time. The offset indicative parameter is a time interval between the first time and the second time. In addition, the exemplary method includes calculating an offset direction parameter by comparing the offset indicative parameter to a non-offset indicative parameter, and establishing the fault direction parameter based on a sign of the calculated offset direction parameter.

An exemplary embodiment of the present disclosure provides a fault direction parameter indicator device for indicating a fault direction parameter of a fault on an AC transmission line of a power distribution system relative to a measurement location of the transmission line. The exemplary fault direction parameter indicator device includes a measurement unit including a current sensor for measuring an AC current at the measurement location of the transmission line to obtain time-domain current data indicative of the measured current. The measurement unit does not include a voltage sensor and is operatively coupled to an input section for transmitting the time-domain current data obtained from the current measurement to the input section. The exemplary fault direction parameter indicator device also includes the input section configured to receive the time-domain current data indicative of the time-dependent current measured by the measuring unit at the measurement location. In addition, the exemplary fault direction parameter indicator device includes a decision logic section configured to determine a fault direction parameter based on the time-domain current data. The decision logic section includes a fault offset calculating sub-section configured to extract, from the current data, an offset indicative parameter indicative of a time offset of the current at a fault time, by identifying a first time and a second time and by identifying a periodically re-occurring feature of the current data, such that the fault time is between the first time and the second time. The offset indicative parameter is a time interval between the first time and the second time, and the periodically re-occurring feature is selected from the group consisting of a zero-crossing, a maximum, a minimum, and a highest gradient of the current data. The exemplary fault direction parameter indicator device also includes an offset direction calculating sub-section configured to calculate an offset direction parameter by comparing the offset indicative parameter to a non-offset indicative parameter, and a fault direction parameter establishing sub-section configured to establish the fault direction parameter from the calculated offset direction parameter.

An exemplary embodiment of the present disclosure also provides a directional overcurrent relay which includes the above-described fault direction parameter indicator device, and a circuit breaker operatively coupled to the fault direction indicator device and configured to receive the fault direction parameter from the fault direction parameter indicator device.

In addition, an exemplary embodiment of the present disclosure provides an outdoor and/or smart grid power distribution network in combination with the above-described fault direction parameter indicator device.

BRIEF DESCRIPTION OF THE DRAWINGS

Additional refinements, advantages and features of the present disclosure are described in more detail below with reference to exemplary embodiments illustrated in the drawings, in which.

Figure 1:
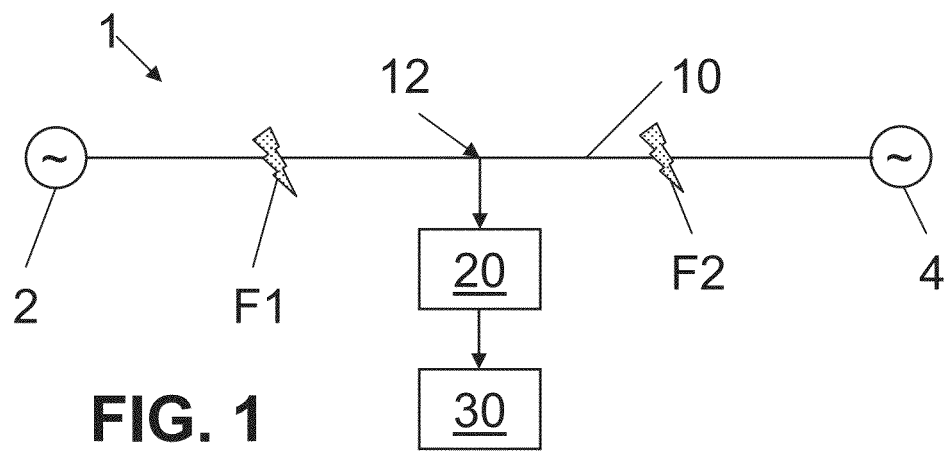
FIG. 1 shows a power distribution system, including a measuring unit and a fault direction indicator device, according to an exemplary embodiment of the present disclosure.

In the drawings and the description of the drawings, the same reference numbers refer to the same or to similarly functioning components. Generally, only the differences with respect to the individual exemplary embodiments are described. Unless specified otherwise, the description of a part or aspect in one embodiment also applies to a corresponding part or aspect in another embodiment.

DETAILED DESCRIPTION

Exemplary embodiments of the present disclosure provide a method of determining a fault direction parameter of a fault on an AC transmission line of a power distribution system relative to a measurement location of the transmission line. Exemplary embodiments of the present disclosure also provide a fault direction parameter indicator device for indicating a fault direction parameter of a fault on an AC transmission line of a power distribution system relative to a measurement location of the transmission line. In addition, exemplary embodiments of the present disclosure provide a directional overcurrent relay including such a fault direction parameter indicator device and a circuit breaker which is operatively coupled to the fault direction indicator device and configured to receive the fault direction parameter from the fault direction parameter indicator device. Moreover, exemplary embodiments of the present disclosure provide for an outdoor and/or smart grid power distribution network including the fault direction parameter indicator device. Further advantages, features, aspects and details that can be combined with exemplary embodiments described herein are evident from the following description and the drawings.

An exemplary embodiment of the present disclosure provides a method of determining a fault direction parameter of a fault on an AC transmission line of a power distribution system relative to a measurement location of the transmission line, for example, for outdoor applications. The method includes measuring, by a measurement unit, a time-dependent AC current of the transmission line at the measurement location, to obtain time-domain current data indicative of the measured current. The measurement unit includes a current sensor for measuring the current at the measurement location of the transmission line but does not include a voltage sensor.

The method also includes transmitting the current data from the measurement unit to a decision logic section, obtaining a fault time of the fault on the AC transmission line, and identifying a first time and a second time by identifying a periodically re-occurring feature of the current data, such that the fault time is between the first time and the second time. The periodically re-occurring feature is selected from the group consisting of a zero-crossing, a maximum, a minimum, and a highest gradient of the current data. In addition, the method includes extracting, from the current data, an offset indicative parameter indicative of a time offset of the current at the fault time. The offset indicative parameter is a time interval between the first time and the second time. The method also includes calculating an offset direction parameter by comparing the offset indicative parameter to the non-offset indicative parameter, and establishing the fault direction parameter based on a sign of the calculated offset direction parameter. The non-offset indicative parameter indicates the absence of a time offset of the current between the first time and the second time.

According to an exemplary embodiment, the extracting of the offset indicative parameter includes choosing integral limits of a current integration time interval such that the current integration time interval is a normal period length of the AC current or an integer multiple thereof, and calculating a numerical integral of the current data over the current integration time interval.

According to an exemplary embodiment, the method includes determining a second fault direction parameter from the current data by a second fault direction determining program, wherein the second fault direction determining program includes receiving a current signal including complex-number pre-fault and post-fault current values from an input section, determining a phase angle of the respective current values, determining a plurality of phase difference values between selected ones of the phase angles, summing at least some of the phase difference values to obtain an accumulated phase difference parameter, and determining the second fault direction parameter by comparing the accumulated phase difference parameter with a threshold value. In addition, the method includes establishing a master fault direction parameter from the first fault direction parameter and from the second fault direction parameter, and outputting the master fault direction parameter.

An exemplary embodiment of the present disclosure provides a fault direction parameter indicator device for indicating a fault direction parameter of a fault on an AC transmission line of a power distribution system, relative to a measurement location of the transmission line. The fault direction parameter indicator device includes a measurement unit which includes a current sensor for measuring an AC current at the measurement location of the transmission line but does not include a voltage sensor. The measurement unit is operatively coupled to an input section for transmitting the time-domain current data obtained from the current measurement to the input section. The fault direction parameter indicator device also includes the input section configured for receiving time-domain current data indicative of a time-dependent current measured by the measuring unit at the measurement location, and a decision logic section configured for determining the fault direction parameter based on the time-domain current data. The decision logic section includes a fault offset calculating sub-section configured to extract, from the current data, an offset indicative parameter indicative of a time offset of the current at a fault time, wherein the extracting the offset indicative parameter includes identifying a first time and a second time by identifying a periodically re-occurring feature of the current data, such that the fault time is between the first time and the second time. The offset indicative parameter is a time interval between the first time and the second time. The periodically re-occurring feature is selected from the group consisting of a zero-crossing, a maximum, a minimum, and a highest gradient of the current data. The fault direction parameter indicator device also includes an offset direction calculating sub-section configured to calculate an offset direction parameter by comparing the offset indicative parameter to a non-offset indicative parameter indicative of an absence of a time offset of the current, and a fault direction parameter establishing sub-section configured to establish the fault direction parameter from the calculated offset direction parameter. According to an exemplary embodiment, the decision logic section is configured to carry out any of the method steps described herein.

The above features allow for the determination of a fault parameter such as a fault direction reliably and efficiently at reduced cost. The cost reduction, among other factors, is possible because no voltage measurement is required, and because the calculations are simple and can be performed at sufficient speed with limited hardware.

Namely, the simple calculations are possible because the offset direction parameter can be calculated, according to features of the present disclosure, based on time-domain current data. Herein, time-domain data are data that represent a quantity, for example, current, as a function of time. In other words, a time can be assigned to the data points. The data can have been subjected to operations which are slightly non-local in time, so that the data is somewhat smeared in time or can include information obtained at other times, as long as a specific time can still reasonably be assigned to the measurement (e.g. a mean time). For example, the data can be subjected to a floating average operation or a low-pass filter for eliminating high-frequency noise. However, this non-local processing should be on a time scale which is less than an AC period of the current, for example, less than 0.2 times the AC period. This ensures fast data availability and limited hardware requirements, since each of the time-domain data can be obtained from a limited number of current measurements quickly after the current measurement. In contrast to frequency domain calculations, no Fourier transform or the like is necessary but only relatively local operations in time domain. Hence, hardware requirements can be reduced.

Further, this method allows for the estimation of, for example, the direction of a fault even if the fault is located near the relay or sub-station, known as a 'close-in fault'. The direction of such faults is difficult to estimate by using a known voltage-based method, because the input voltages at the measurement location tend to become zero. Since the above aspects rely on a current measurement and not a voltage measurement, there is no such problem in this case.

Further, the above features allow for the selection of a phase angle sensitivity independently of a sampling rate of the current measurement. In particular, a phase angle sensitivity can be obtained which is lower than the normal phase change between two current measurements (sampling angle).

Reference will now be made in detail to the various exemplary embodiments, one or more examples of which are illustrated in each drawing. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations. Especially, the examples below relate to a fault direction indicator device. However, the methods described herein can also be used in other protection functions (other than direction estimation).

Herein, when reference is made to a current value measured at a specific time or to a time-domain current value measurement, such terminology implies that a time can be assigned to such a measurement, but not necessarily that the measurement is completely local in time. For example, the measurement can be smeared in time or can include information obtained at other times, as long as a specific time can still reasonably be assigned to the measurement (e.g. a mean time). For example, time domain measurement data can be obtained by processing a time-dependent measurement through a low-pass filter for eliminating high-frequency noise.

Also, if it is stated that pre-fault and post-fault signals are transmitted, this does not necessarily imply that a distinction between pre-fault and post-fault signals would be known at the time of transmitting. Such a distinction can also be established at a time after transmission, for example, after the processing of the signals or after obtaining additional information from other sources.

The operative features of various components may hereinafter be described with respect to the functions such components perform. It is to be understood that such components contain the necessary processing circuitry to perform the operative functions. For example, the components can include a processor configured to execute a computer program tangibly recorded on a non-transitory computer-readable recording medium (e.g., a non-volatile memory), to carry out the operative functions described herein.

FIG. 1 shows a power distribution system 1 according to an exemplary embodiment of the present disclosure. Herein, a transmission line 10 connects a power source 2 (e.g., a distributed generation source bus) to a grid 4, such as to feed the grid 4 from the power source 2. Further, a measuring unit 20 is connected to the transmission line 10 at a measurement location 12. Relative to the measurement location 12, the transmission line is divided into an upstream, or backward, portion (side of the source 2, between source and relay) and a downstream, or forward, portion (side of the grid 4, between relay and line or grid). As described above, in smart grids, the power flow direction can change with time, but "forward" and "reverse" can still be defined with respect to the current power flow.

The measuring unit 20 is configured to measure a current flowing in the transmission line 10 at the measurement location 12. A fault direction indicator device 30 receives a current signal indicative of the measured current from the measuring unit 20, and has the functionality of indicating a direction of a fault on a transmission line 10 from the current data, for example, the functionality of indicating whether the fault has occurred in the backward direction or in the forward direction relative to the measurement location 12.

The measurement unit 20 includes a current sensor for measuring the current at the measurement location 12 of the transmission line 10. The measurement unit 20 does not include any voltage sensor. The measurement unit 20 is operatively coupled to the fault direction indicator device 30 (more precisely, to the input section 32 thereof shown in FIG. 4 below) for transmitting a current signal obtained from the current measurement to the fault direction indicator device 30 (to the input section 32).

As will be described in more detail below, the fault direction indicator device 30 has the functionality to indicate the directional information by using only the current data provided from the measuring unit 20, without any reference voltage. This results in a major cost advantage, because there is no need for a voltage sensor in the measuring unit 20. Since a power distribution system may require many relays as the one depicted in FIG. 1, the overall cost advantage can be significant.

Generally, the configuration will be more complex, for example, when the transmission line 12 is not directly connected to the power source 2 upstream, but is connected via a bus of a more complex network. Similarly, the downstream configuration can be more complex. Also, for simplicity, only a single-phase line is shown. Generally, the network will have more phases (for example, three phases). The case of more than one single-phase line will be further discussed below.

Figure 4:
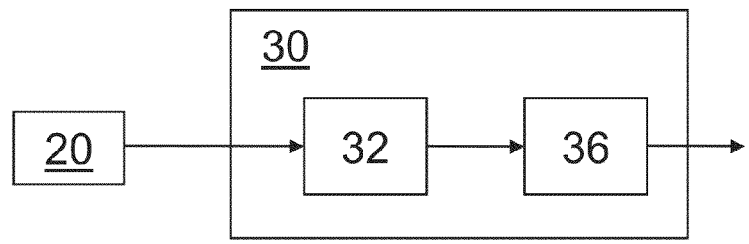
FIG. 4 shows the measuring unit and the fault direction indicator device of FIG. 1 in more detail, according to an exemplary embodiment of the present disclosure.

Now, with reference to FIG. 4, the fault direction indicator device 30 of FIG. 1 is described in more detail. The fault direction indicator device 30 has an input section 32 and a decision logic section 36. The input section 32 is configured to receive transmission line data, for example, data relating to the transmission line, and more particularly the current signal from the measuring unit 20, without receiving any voltage signal.

Thus, the transmission line data received by the input section 32 includes the current signal and possibly other non-voltage data, but does not include any voltage data or, for example, mixed current-voltage data. In other words, the transmission line data is free of data resulting from a voltage measurement.

The decision logic section 36 is operatively connected to the input section 32 for receiving the transmission line data (which also includes the case of data processed from the transmission line data). The decision logic section 36 includes a first fault direction determining program for determining the fault direction from the transmission line data and for outputting the determined fault direction as a first fault direction indicator.

In the following, the decision logic section 36, and more particularly the first fault direction determining program will be described in more detail. The program's task is to extract the direction information from the transmission line data, for example, especially from the current signals, in case of a fault. With the algorithms described below, the direction of the fault is detected from current measurements, without using voltage signals.

Now, before the decision logic is described in detail, the model according to which the fault direction can be derived from the current only will be described with reference to FIGS. 1 to 3. FIG. 1 shows two possible faults of the power transmission line 10, a downstream fault F2 and an upstream fault F1.

In the case of upstream fault F1, the fault current $I_{F1}$ flowing from the grid 4 to the fault F1 is $$I_{F1} = V_4/Z_{4-F1} \quad (1),$$

wherein $V_4$ is the voltage at the grid 4, and wherein $Z_{4-F1}$ is the impedance between the grid 4 and the fault location of fault F1. (Here, all quantities are AC quantities given as phasors, e.g., complex numbers). Likewise, in the case of downstream fault F2, the fault current $I_{F2}$ flowing from the source 2 to the fault F2 is $$I_{F2} = V_2/Z_{2-F2} \quad (2),$$

wherein $V_2$ is the voltage at the source 2, and wherein $Z_{2-F2}$ is the impedance between the source 2 and the fault location of fault F2.

The impedances $Z_{4-F1}$ and $Z_{2-F2}$ are not exactly known and can be different from one another. However, because the line 10 is generally almost purely inductive with negligible resistance and capacitance, the impedances $Z_{4-F1}$ and $Z_{2-F2}$ are almost purely imaginary with a negative imaginary component.

Now, if $I_{pre}$ is the pre-fault current from the source 2 to the grid 4, then, the total post-fault current $I_1$ in the case of upstream fault F1 is $$I_1 = I_{pre} - I_{F1} = I_{pre} - V_4/Z_{4-F1} \qquad (3).$$

Likewise, the total post-fault current $I_2$ in the case of downstream fault F2 is $$I_2 = I_{pre} + I_{F2} = I_{pre} + V_2/Z_{2-F2} \qquad (4).$$

Please note the difference in sign, which is due to the fault current $I_{F1}$ being directed in the opposite direction to the pre-fault current (from grid 4 to fault F1), whereas the fault current $I_{F2}$ is directed in the same direction as the pre-fault current (from source 2 to fault F2).

Figure 2:
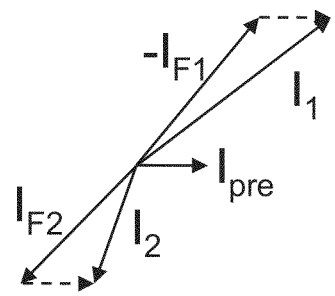
FIG. 2 shows a current-phasor diagram useful for understanding aspects of the present disclosure.

This sign difference is visible in the current-phasor diagram of FIG. 2. Here, the current, represented as a complex number in the complex plane, jumps from $I_{pre}$ to $I_1$ or $I_2$, as given in Eqns. (3) and (4), in the case of a upstream or downstream fault, respectively. Here, the short-circuit current phasors $-I_{F1}$ and $I_{F2}$ by which the current phasor can jump have mutually opposite sign due to the sign difference in Eqns. (3) and (4), and due to $Z_{4-F1}$ and $Z_{2-F2}$ being both imaginary with a negative imaginary component. Hence, the phase angle of the post-fault current ($I_1$ or $I_2$) relative to the pre-fault current $I_{pre}$ has a phase change depending on and indicating the fault direction: For example, a positive phase angle change can indicate fault in the upstream direction, while a negative phase angle change can indicate fault in the downstream direction. Hence, it is possible to determine the direction of the post-fault current (forward and backward/reverse) with respect to $I_{pre}$ only, without requiring any bus voltage. Thus, the current alone contains sufficient information to determine the fault direction, namely the information contained in the phase change of the current during the fault.

Figure 3:
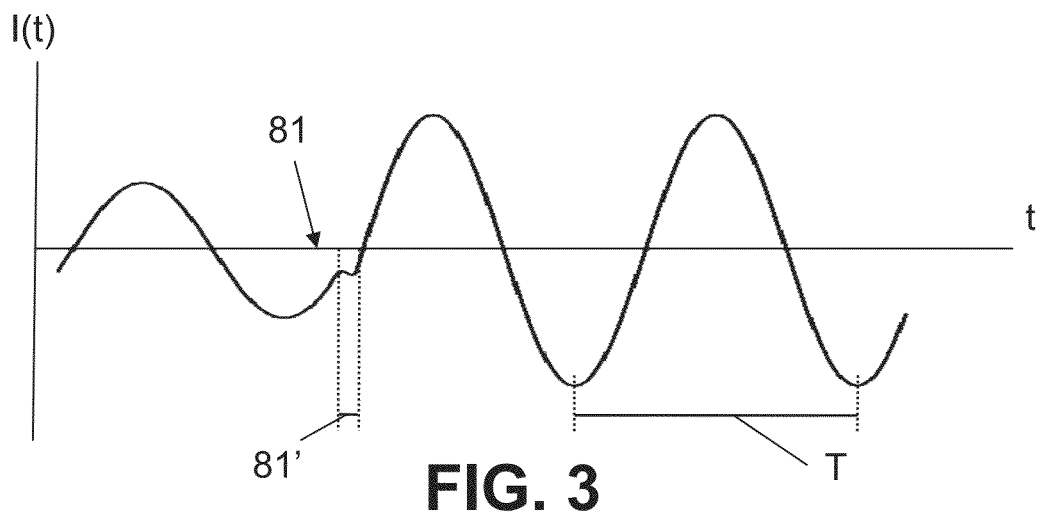
FIG. 3 shows a time-vs.-current diagram useful for understanding aspects of the present disclosure.

FIG. 3 is a diagram showing an idealized current as a function of time, in the case of a fault at a fault time 81. The pre-fault current before the fault time 81 is an AC current of sinusoidal shape with AC cycle or AC period T. After the fault, the post-fault current is again an AC current of sinusoidal shape, but with a larger magnitude and—more importantly here—with a phase shift $\Delta\phi$ with respect to the pre-fault current. In other words, if the pre-fault current can be described by the time-dependence $I_0 \cdot e^{i\omega t}$, then the post-fault current can be described by the time-dependence $c \cdot I_0 \cdot e^{i(\omega t + \Delta\phi)}$, wherein c is a real number, and $\omega = 2\pi/T$ is the frequency, T being the AC period. This phase shift $\Delta\phi$ leads to a time-domain offset 81' of the current. This time offset 81' has the magnitude $\Delta t = \Delta\phi/\omega = (\Delta\phi/2\pi) \cdot T$. As shown in FIG. 3, due to the phase shift $\Delta\phi$ the periodic current curve after the fault 81 is shifted by the time offset $\Delta t$ (reference sign 81') relative to the current curve before the fault 81.

Figure 6A:
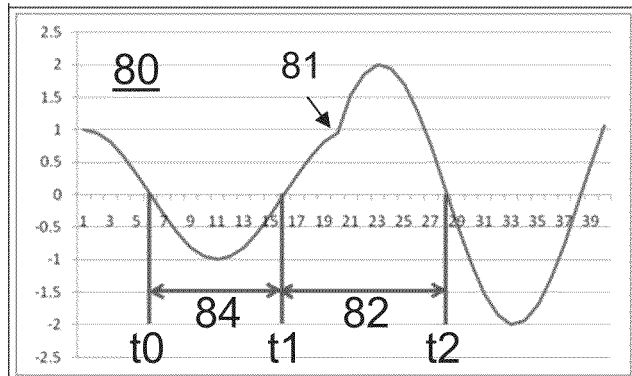
FIGS. 6a to 6d show time-vs.-current diagrams illustrating a method of determining the fault direction according to an exemplary embodiment of the present disclosure.
Figure 6B:
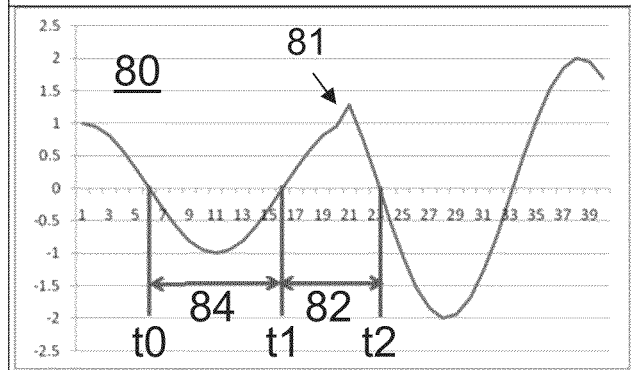
Figure 6C:
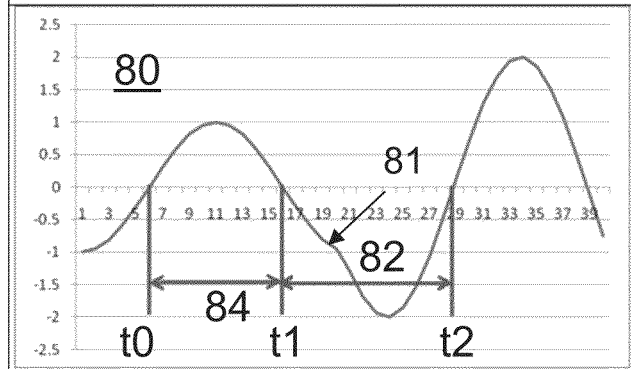
Figure 6D:
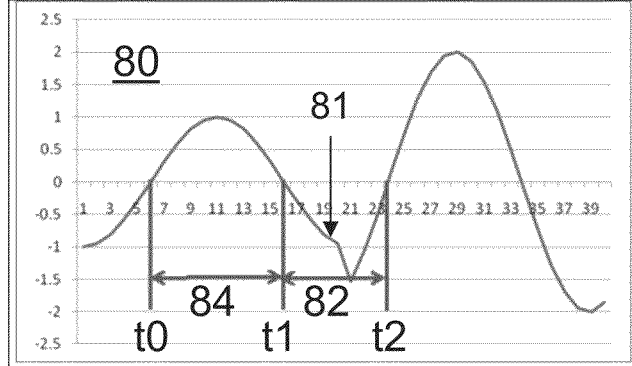

For determining the fault direction, the inverse problem of the model discussed above is to be solved: The problem is to extract the phase shift from some—possibly noisy—current data, so that the fault direction can be determined based on the phase shift. A possible algorithm is described in the following with reference to FIGS. 6a to 6d. In FIGS. 6a and 6c, a negative phase shift indicating a forward fault is shown, whereas in FIGS. 6b and 6d, a positive phase shift indicating a reverse fault is shown.

According to the algorithm, the currents are continuously measured by a measurement unit 10 at the measurement location 12 (see FIG. 1), also during normal operation. If a feeder protection system such as a current-only protection device (e.g. from ABB) is used as the measurement unit, such a system continuously monitors the AC properties of the current and adapts the sampling frequency such that the number of samples per AC cycle corresponds to the sampling rate. Alternatively, a fixed sampling frequency can also be used for the sampling, the frequency being based on, for example, a clock signal. In FIGS. 6a to 6d, the current diagram 80 is shown as a smooth function of time, corresponding to a very high sampling rate. In case of a lower sampling rate, this smooth current function would be replaced by a set of discrete data points similar to the data points of FIG. 7.

During operation, zero crossing times are determined, for example, times at which the current changes sign. In FIGS. 6a to 6d, these zero crossing times are denoted as t0, t1 and t2. Here, t0 and t1 are obtained during normal operation (e.g., prior to a fault 81), and t2 is obtained after the fault 81. The zero crossing times t0, t1, t2 are obtained as the times between two subsequent current measurement $I_n$ and $I_{n+1}$ (measured at times $t_n$ and $t_{n+1}$) having opposite sign. The zero crossing time can then be obtained e.g. as $(t_n + t_{n+1})/2$ or, more precisely, by triangulation as $t_n - (t_{n+1} - t_n) \cdot I_n / (I_{n+1} - I_n)$.

In case of a fault, indicated by reference sign 81, a fault signal is issued by the feeder protection system and received by the fault direction indicator device. The fault can be detected, for example, by the current (in any phase) exceeding a threshold value. According to an exemplary embodiment, at the moment of the fault or shortly thereafter, a start command is issued. If the fault persists for some time, for example, if the current still exceeds the threshold after a few AC cycles (say, two AC cycles), a trip command is issued causing a part of the power distribution system to be disconnected. Alternatively, the trip command can also be issued earlier if the current exceeds a further, higher threshold. The start and trip signals are generally issued from, for example, a feeder protection system in response to the current exceeding a threshold value or to some other fault-indicating event.

The fault direction indicator device should output the directional information at the time of the trip command, which may be issued after the trip interval. Namely, a "trip" command is issued a few cycles (say, n cycles with n≥1 or even n≥2) after the "start" command or the fault event. In particular, the "trip" command is to be issued after n=2 cycles after the detected fault event or after the "start" command.

Thus, when the trip command is issued or soon before the trip command is expected to be issued, the fault direction indicator device has a number of pre-fault zero crossing times, for example, t0 and t1, available, and at least one post-fault zero-crossing time t2. From these times, the decision logic section calculates a no-fault zero crossing time interval 84, defined as the time intervals between two neighboring zero crossing times with no fault between the times t0 and t1. Alternatively, the no-fault zero crossing time interval 84 can be obtained by averaging several such time intervals prior to a fault, for example, the last five time intervals. Alternatively, the time interval 84 can be obtained from an external source, for example, an AC current generator, as half the AC period.

Further, the decision logic section calculates a fault zero crossing time interval 82, defined as the time intervals between the two neighboring zero crossing times t1 and t2 having the fault 81 there between. The fault zero crossing time interval 82 is an offset indicative parameter, because it contains information about the time offset of the current at the fault time 81. If the fault zero crossing time interval 82 is longer than the no-fault zero crossing time interval 84, as in FIGS. 6a and 6c, then the time offset is positive, indicating a negative phase shift. If, on the other hand, the fault zero crossing time interval 82 is shorter than the no-fault zero crossing time interval 84, as in FIGS. 6b and 6d, then the time offset is negative, indicating a positive phase shift.

The decision logic section extracts this time offset information by comparing the fault zero crossing time interval 82 to the non-fault zero crossing time interval 84, for example, the corresponding time interval in which a time offset is absent. For this purpose, the decision logic section calculates an offset direction parameter indicative of the time offset direction. For example, this offset direction parameter can be a difference between the time intervals 82 and 84, optionally divided by the time interval 84. Then, by the sign of the offset direction parameter, the offset direction is established. For example, a positive sign can indicate a positive offset (e.g., the fault zero crossing time interval 82 is larger than the non-fault zero crossing time interval 84), and a negative sign can indicate a negative offset (e.g., the fault zero crossing time interval 82 is smaller than the non-fault zero crossing time interval 84).

Also, the magnitude of the offset direction parameter can indicate how significant the difference between the fault zero crossing time interval 82 and the non-fault zero crossing time interval 84 is, and hence how reliable the determined offset direction information is.

As was discussed above with reference to FIGS. 1 to 3, the offset direction allows for the indication of the fault direction. Accordingly, the decision logic section establishes the fault direction parameter based on the calculated offset direction parameter. For example, a positive offset direction parameter indicating a negative phase shift can indicate a forward fault, and a negative offset direction parameter indicating a positive phase shift can indicate a reverse fault.

More generally, the decision logic section can determine the fault direction parameter by comparing the offset direction parameter OD to a threshold value. According to the above example, a forward fault will be determined if OD>0, and a reverse fault will be determined if OD<0. In practice, a small threshold number $\epsilon$ is used as a threshold, and a forward fault will be determined if OD>$\epsilon$, and a reverse fault will be determined if OD<−$\epsilon$. A neutral fault (indicating unknown fault direction) will be issued if |OD|≤$\epsilon$. This way, for situations in which the offset direction parameter OD is close to zero so that its sign cannot be determined reliably, the generation of a potentially unreliable signal is avoided. The determined fault direction (forward, backward or neutral) is then outputted.

Regarding the sign of the offset direction parameter, it is noted that while the sign is indicative of the fault direction, the assignment of a particular sign (positive or negative) to a particular fault direction (forward or backward) depends on a number of line parameters, as well as sign conventions, so there can also be situations in which a forward fault is expected if OD<0, and a reverse fault is expected if OD>0.

Figure 7:
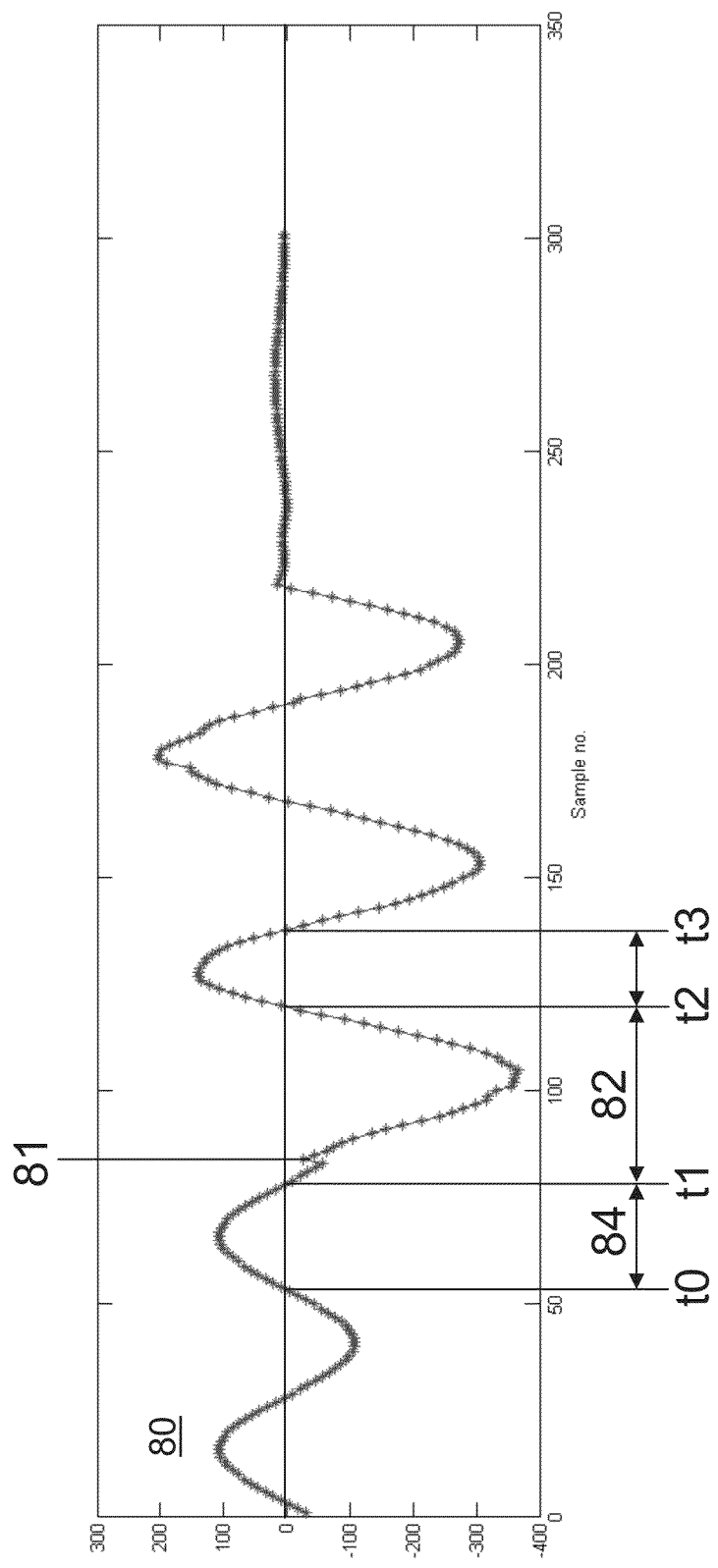
FIGS. 7, 8 and 9 show further time-vs.-current diagrams illustrating respective methods of determining the fault direction according to exemplary embodiments of the disclosure.

FIG. 7 is a current-vs-time diagram similar to the diagrams of FIG. 6c. However, in FIG. 7, instead of an idealized current as in FIG. 6c, more realistic sampled current data with a non-zero sampling rate is shown. As in FIG. 6c, the negative phase shift at the fault 81 is clearly visible. As in FIG. 6c, this negative phase shift leads to a longer-than-average fault zero crossing time interval 82. Therefrom, the fault direction can be extracted as described above.

As a further difference with respect to FIG. 6c, it can be seen that a DC current component is present due to the fault, shifting the total current curve towards negative values. Consequently, the lower half-cycles (e.g., half-cycle between zero crossings t1 and t2) is further lengthened and the upper half-cycle (e.g., half-cycle between zero crossings t2 and t3) is further shortened. Thus, the DC current leads to an additional change of the time interval 82 which is independent of a time offset of the current and can therefore introduce errors.

The problem associated with the DC current can be reduced by identifying, instead of zero crossings, some other periodically re-occurring feature of the current data 80. For example, a maximum, a minimum, or a highest gradient of the current data can be selected. These periodically re-occurring features of the current data can be less dependent on the additional DC current.

Alternatively, the DC current can be corrected by shifting the current curve vertically such as to offset the effect of the DC current. For this purpose, the decision logic section calculates the average DC current during one period (e.g., from time t1 to t3) by summing the sampled current values during this period and dividing the sum by the number of sampled currents. Then, the average DC current is subtracted from each of the current values.

Figure 8:
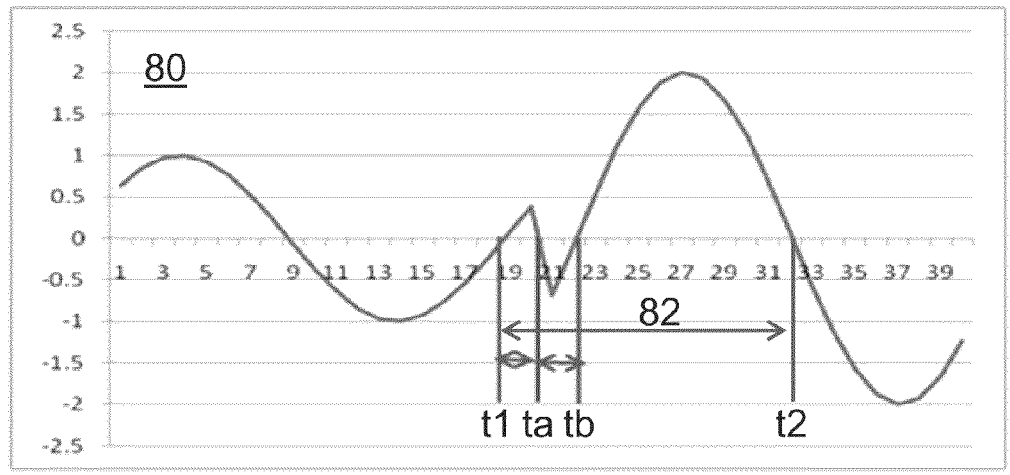

FIG. 8 is a current-vs-time diagram similar to the diagram of FIG. 6a, illustrating a situation in which the phase shift occurs near the zero crossing such that multiple zero crossings are generated at times t1, ta, tb.

According to an exemplary embodiment, the algorithm is modified as follows in order to yield correct results in this type of situation. The decision logic section checks for multiple (e.g., two or more) short interval zero-crossings, occurring in a short time interval shorter than a predetermined threshold time. The threshold time is much shorter than one period T, for example, a period multiplied by a factor of 0.3 or 0.2 or 0.1, or even less. If the decision logic section finds such multiple short interval zero-crossings (here: t1, ta, tb), then it checks if the multiple zero-crossings are an uneven number. If not, then the decision logic section determines the closest further zero-crossing and includes this further zero-crossing to the multiple short interval zero-crossings in order to obtain an uneven number. Subsequently, the decision logic section checks whether a fault is observed during the short time interval. If yes, the multiple short interval zero-crossings t1, ta, tb are replaced by their lowest member t1, and the fault zero crossing time interval 82 is calculated beginning with t1. The other short interval zero-crossings ta, tb are then ignored. Alternatively, the latest interval tb can be taken and the fault zero crossing time interval ending with tb.

In case no fault is detected near such multiple short interval zero-crossings, then this can be due to noise in the current data. In this case, either the time intervals ending with the short interval zero-crossings can be ignored as unreliable when calculating the no-fault zero crossing time interval 84 (see FIGS. 6a to 6d), or the middle zero-crossing time ta can be used and the other times t1, tb can be ignored.

Thus, as a general aspect, the decision logic section monitors whether the current data contains at least two of the periodically re-occurring features at times closer to the fault time 81 than a predetermined threshold, and in this case ignores at least one of the at least two periodically re-occurring features. In particular, the decision logic section obtains an uneven number of the periodically re-occurring features, and selects only one of the periodically re-occurring features and ignores the others.

Figure 9:
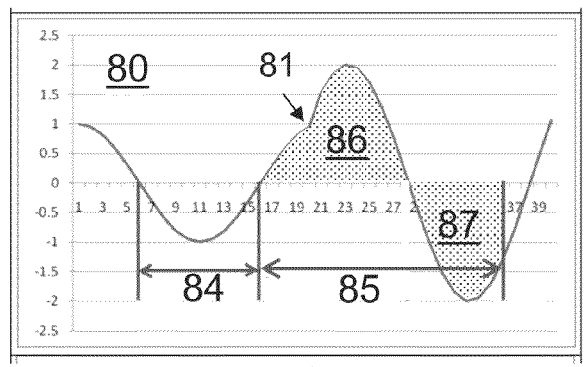

FIG. 9 is a current-vs-time diagram in which yet another exemplary embodiment is illustrated. According to this exemplary embodiment, the decision logic section first determines a period length 85. For example, the period length 85 can be determined as two times the no-fault zero crossing time interval 84, wherein the no-fault zero crossing time interval 84 can be determined as above or according to a similar method (e.g. the double can be determined by using the times of second-next neighboring zero crossings). Alternatively, the period length 85 can be obtained from an external source, e.g. an AC current generator.

Then, the decision logic section calculates a numerical time integral (e.g., sum or other numerical approximation of a current time integral) of the current data. The integral limits are chosen such that (i) the integral is taken over a current integration time interval being the normal period length 85 or an integer multiple thereof, and (ii) the fault 81 is included in the integral. In FIG. 6, the integral is taken from the last zero crossing before the fault 81 for one period length. The integral can be represented by the dotted area 86 between the time axis and the positive portion of the current curve, minus the dotted area 87 between the time axis and the negative portion of the current curve.

This integral is an offset indicative parameter, depending on the offset as follows. As seen in FIG. 9, the current data curve after the fault 81 is shifted to the right due to the positive offset at the fault time 81. The offset thus leads to an increase of the positive-current area 86 and to a decrease of the negative-current area 87. Thus, a positive offset is indicated by a positive integral.

In case that the fault is in a negative-current region instead of the positive-current region 86 shown in FIG. 9, then a positive offset would be signalled by a negative integral. Hence, an offset direction parameter is obtained by multiplying the integral described above by the sign of the current during the fault.

An integral indicative of an absence of a time offset would ideally be zero, because in the absence of an offset the integral is expected to be zero or close to zero, for example, smaller than a predetermined threshold $\epsilon$. Hence, from the offset direction parameter, for example, the integral with the sign being adapted as described above, the fault direction parameter can be calculated in analogy to the description above with reference to FIGS. 6a to 6d. The method of FIG. 9 can in some cases be more robust than the zero-crossing method with respect to noise because it relies on a sum of many measurements by which some noise effects are cancelled out. In a variation of the method, a DC current can be compensated in the same manner as described in relation to FIG. 7.

Thus, as a general feature of the present disclosure, the offset indicative parameter is a numerical time integral of current data within a time interval including the fault time. The time interval can be an integer multiple of an AC period or a parameter related to the AC period, for example, one AC period. A non-offset indicative parameter can be zero or a comparable integral of current data within a time interval not including the fault time. The offset direction parameter can be based on the offset indicative parameter multiplied by a sign, especially by a sign depending on the current data at the fault time.

In the above discussion, only a single-line system has been described. In reality, most power distribution systems have three current phases. For such a three-phase system, a single representation for the currents in all three current phases can be used. Thus, according to an exemplary embodiment of the present disclosure, the current signals from all three current phases $I_1, I_2, I_3$ are combined into a combined current signal. As the single representation, the positive sequence component or positive phase sequence (PPS) current signal $I_{PPS} = I_1 + e^{i\omega T/3} \cdot I_2 + e^{2i\omega T/3} \cdot I_3$ can be used. Then, the combined current signal can be evaluated, as described above, by calculating the zero crossings or other offset indicative parameters based on the combined current signal. Thus, the same analysis as mentioned above for the single-line case can be performed, and the above described method can be applied with the current signal being the positive sequence component or some other combined current signal.

However, in practice, this approach is not always stable and can result in a false determination of the fault direction. Especially, when using the positive phase sequence component, the phase angle is influenced, for example, by frequency deviation, inherent unbalances in the 3-phase line input, and measurement noise. Consequently, the angle of the PPS current signal is less stable than can be desired.

Therefore, according to an exemplary embodiment of the present disclosure, the offset indicative parameters and, based on these, the offset direction parameters are calculated for each current phase individually, as described above, instead of being calculated for a combined current signal. As a result, the offset direction parameters for the individual current phases are more stable than the combined current signal. Then, the maximum of the three offset direction parameters is taken and, using the maximum, the fault direction parameter is obtained as described above. There are other methods for combining the offset indicative parameter, for example, by taking the mean of the offset indicative parameters, such as the fault zero crossing time interval 82, for each phase.

According to an exemplary embodiment, three individual-current fault direction parameters are calculated, one for each current phase p. Then, a majority-vote or unanimous-vote decision algorithm is used for determining the fault direction parameter to be outputted.

The above method relies on the pre-fault current as the polarizing quantity, instead of, for example, the voltage. Therefore, to judge the direction, as baseline information, the relay should see valid pre-fault current for a particular duration, in order to obtain reliable zero crossings or other periodically re-occurring features of the current data. If there is no valid pre-fault current of sufficiently stable phase oscillations, the results would be less reliable. Therefore, the magnitude of the fundamental component of the input signal (current) is compared to a current threshold. If the current is not above the current threshold for the last two cycles, no direction information is output. Instead, a "neutral" signal is output indicating inconclusive directional information.

As a threshold, 10% of the nominal current value can be chosen, for example. Then, the magnitude of the fundamental component of the current must be above 10% of the nominal current value for at least two cycles, otherwise the "neutral" signal is output. Such kind of cases might occur when for example, the device is turned on a during fault condition, for example, in a case of switch on to fault state.

Figure 5:
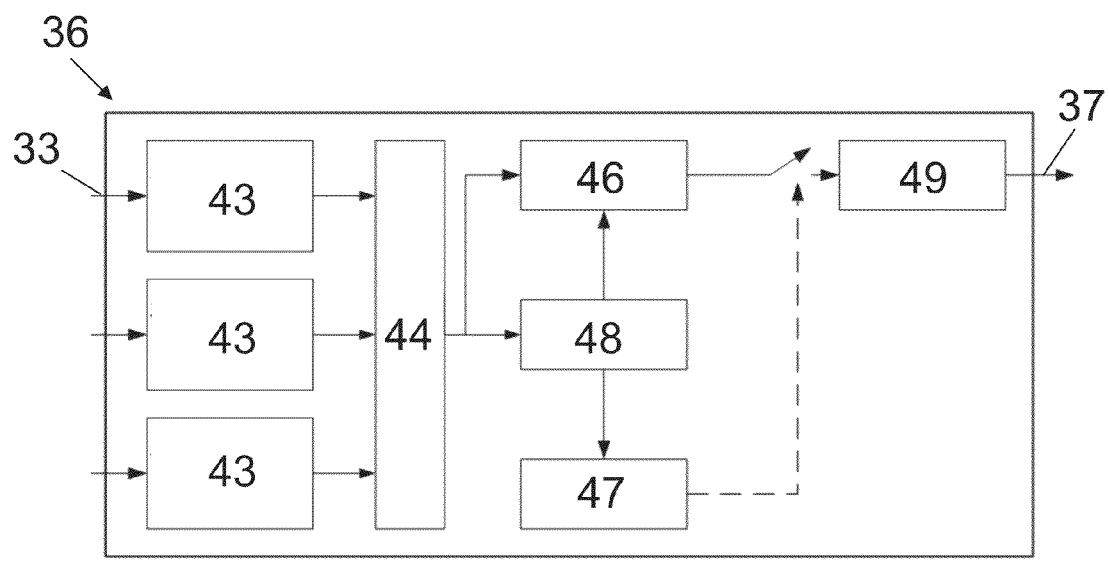
FIG. 5 shows a decision logic section of a fault direction indicator device in more detail, according to an exemplary embodiment of the present disclosure.

FIG. 5 shows a signal processing sequence of a fault direction determining program of the decision logic section 36 according to the above algorithm. First, the time-domain current data is received from the input section, for each one of three current phases (arrows 33). Then, for each current phase an offset direction parameter calculating module 43 calculates the offset direction parameter indicative of the time offset direction for the current phase. For example, the offset direction parameter can be the difference between the fault zero crossing time interval 82 and the non-fault zero crossing time interval 84 shown in FIGS. 6a to 6d and 7, and can be calculated according to the method described above.

Then, a maximum-selection section 44 selects the maximum of the offset direction parameters for each current phase, and the maximum offset direction parameter is transmitted to a direction logic 46 and optionally to a threshold limit comparator 48. The direction logic 46 determines, based on the maximum offset direction parameter, the fault direction parameter (forward or backward or optionally neutral) as described above.

According to an exemplary embodiment, the threshold limit comparator 46 receives current values and compares the to one or more fault threshold(s). Based on the comparison, the threshold limit comparator 46 then determines whether a "break" signal should be sent. Possibly, if only an intermediate threshold is reached, the threshold limit comparator 48 issues a "start" command initiating a one cycle wait signal carried out by one cycle wait module 47, and the threshold can be monitored again after the wait for deciding on the "break" command.

In case of a break command, not only the break command is sent, but also the fault directional parameter determined by the direction logic 46 is sent by a relay state module 49, as directional signal 37.

Some of the above steps can be performed continuously, even in the absence of a fault. Also, a fault-time indicator section (not shown) can be provided for determining the time of a fault, and transmitting the time of the fault to the offset direction parameter calculating module 43.

In accordance with an exemplary embodiment, the decision logic 36 can further includes a second fault direction determining program, besides the above-described (first) fault direction determining program. The second fault direction determining program determines the fault direction from the current data in addition, but according to a different algorithm. Then, the second fault direction determining program outputs a second fault direction indicator. The first fault direction determining program and the second fault direction determining program can run either on the same hardware (e.g. in parallel) or on different pieces of hardware.

For example, the second fault direction determining program can determine the fault direction from an additional algorithm as described in EP 10172782.4, which is hereby incorporated by reference in its entirety, and especially with respect to its description of FIGS. 5 and 6 thereof. This additional algorithm is described in the following:

According to the additional algorithm, the currents are continuously measured by a measurement unit 10 at the measurement location 12 (see FIG. 1), also during normal operation. If a feeder protection system such as a current-only protection device (e.g. from ABB) is used as the measurement unit, such a system continuously monitors the AC properties of the current. Also, a protection device is generally capable of representing the current as a complex number with a real part representing the measured current and the imaginary part representing phase information. The complex-number current values are then transmitted, as a current signal, to the fault direction indicator device. The fault direction indicator device stores the complex-number current values in a buffer for some time. Here, the current values are referred to as $I_j$, where j is an index representing the number of the sample, some smaller j being the earliest sample and some larger j being the most recent sample.

In the following, k shall indicate the index corresponding to a time close to the fault event, ideally the index corresponding to the time of the last sample before the fault event. Then, the currents $I_j$, j≤k, represent the pre-fault currents before the fault, and the currents $I_j$, j>k, represent the post-fault currents.

When the trip command is issued or soon before the trip command is expected to be issued, the fault direction indicator device has a plurality of post-fault current values available, for example, complex-number values of the sampled current measurements taken after the fault. These post-fault current values are also referred to as $I^{post}(i)=I_{k+i}$, with 1≤i≤n*N, N being the sample rate.

From the post-fault current values, the decision logic section then determines a plurality of phase difference values, namely the phase difference values $\Delta\phi(I^{post}(i), I^{pre}(i))$ between the i-th post-fault current values $I^{post}(i)$ and the respective i-th pre-fault current values $I^{pre}(i)$. Here, the i-th pre-fault current values $I^{pre}(i)$ are defined as the samples taken at an integer number m of cycles previous to the corresponding i-th post-fault current values $I^{post}(i)$. Thus, if $I^{post}(i)=I_{k+i}$, then $I^{pre}(i)=I_{k+i-m*N}$. Here, the parameter m indicates how many cycles should lie between the i-th pre-fault and post-fault currents, and m can in principle be chosen freely with m≥n. According to an exemplary embodiment, m=n is chosen. In an example, m=n=2, hence the pre-fault current value $I^{pre}(i)$ is the current sample taken two cycles before the corresponding post-fault current value $I^{post}(i)$. The complex phase difference $\Delta\phi(a, b)$ between two complex numbers a and b is calculated as $\Delta\phi(a, b)=\arctan(\text{Im}(a/b)/\text{Re}(a/b))$. Also, the phase difference values $\Delta\phi(I^{post}(i),I^{pre}(i))$ can be calculated by using, e.g. Fourier analysis or other methods.

After having obtained the plurality of phase difference values $\Delta\phi(I^{post}(i), I^{pre}(i))$, the decision logic section then accumulates them into an accumulated phase difference parameter $\Delta\phi$. According to an exemplary embodiment, this is done by summing the phase difference values according to the formula $$\Delta\phi=\Sigma_{i=1}^{n*N}\Delta\phi(I^{post}(i),I^{pre}(i)).$$

Then, the decision logic section determines a fault direction parameter by comparing the accumulated phase difference parameter to a threshold value. For example, a reverse fault will be determined if $\Delta\phi>0$, and a forward fault will be determined if $\Delta\phi<0$. In practice, a small threshold number ϵ is used as a threshold, and a neutral fault (indicating unknown fault direction) will be issued if $|\Delta\phi|\leq\epsilon$. There can also be situations in which a reverse fault is expected if $\Delta\phi<0$, and a forward fault is expected if $\Delta\phi>0$.

Figure 11:
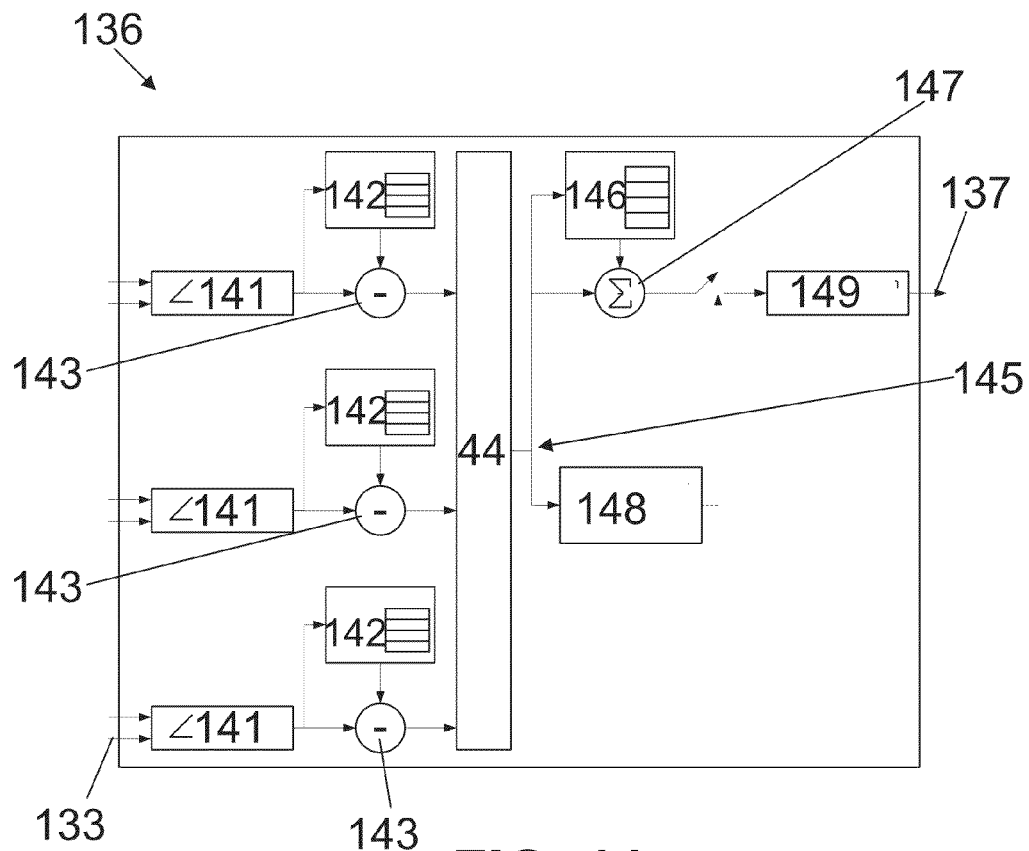
FIG. 11 shows a further decision logic section of a fault direction indicator device according to an exemplary embodiment of the present disclosure.

FIG. 11 shows a signal processing sequence of a fault direction determining program of the decision logic section 136 according to the above additional algorithm. First, the current signal comprising the complex-number pre-fault and post-fault current values is received from the input section (arrows 133). Then, a phase angle extraction module 141 determines the phase angle of the respective current values. The phase values can be computed, for example, by Fourier analysis or other methods. In particular, if the arctan function is used as described above, this function can be implemented by a table lookup so as to speed up computation. The phase angles are stored in a phase angles storage 142. In the case of a fault, the N*n pre-fault angles are available and the N*n post-fault angles are or will soon be available. Then, a phase angle subtractor 143 subtracts the i-th post-fault angle from the i-th pre-fault angle and thus determines the i-th phase difference value $\Delta\phi(I_p^{post}(i),I_p^{pre}(i))$, for i=1 ... n*N. Then, a maximum-selection section 144 selects the maximum of the phase difference values for each current phase, and the maximum phase angle difference is stored in a storage section.

The above steps or some of the above steps can be performed continuously, even in the absence of a fault. Also, a fault-time indicator section 148 can use the maximum phase difference for determining the time of a fault in the case where a start command is issued, for example, by comparing the maximum phase difference of each sample i to a threshold value, or by obtaining the maximum phase difference.

After the fault, an accumulator 147 accumulates the maximum phase difference for n post fault cycles (e.g. 2 post fault cycles), for example, by summing the phase differences, to obtain the accumulated phase difference parameter $\Delta\phi$. Then, by comparing $\Delta\phi$ with a threshold value, a determining section 149 determines the fault direction as described above.

Figure 12:
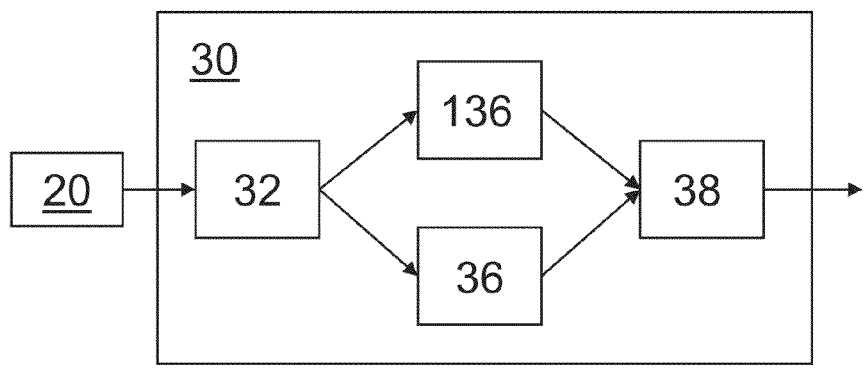
FIG. 12 shows a measuring unit and a fault direction indicator device according to an exemplary embodiment of the present disclosure.

As shown in FIG. 12, the algorithms of FIG. 5 can be combined as follows with an additional algorithm such as the algorithm described with reference to FIG. 11. The fault direction indicator device 30 has an input section 32 (as in FIG. 4) and two decision logic sections 36 and 136. The input section transmits the current data to both decision logic sections 36 and 136. The decision logic section 36 is adapted for carrying out any method described herein, in particular any method according to the present disclosure. The additional decision logic section 136 is configured to carry out any further method described herein being different from the method carried out by the decision logic section 36, such as the method described with reference to FIG. 11, for example. The decision logic sections 36 and 136 output respective fault direction parameters and optionally a parameter indicating the reliability of their calculation. For example, such a reliability-indicating parameter can be the magnitude of the offset direction parameter or a quantity derived therefrom.

The fault direction indicator device 30 also includes a decision joining program 38 for determining a master fault direction from the respective fault direction parameters output by the decision logic sections 36 and 136. Then, the resulting determined master fault direction is outputted by the decision joining program 38.

In the case of the decision logic sections 36 and 136 being in mutual disagreement over the fault direction, the decision joining program 38 can determine the fault direction as neutral, or by decision weighting, for example, by attributing different weightings to the first and the second fault direction indicator, and by taking the result with the higher weighting. The weightings can be determined by taking into account the parameters indicating the reliability of the calculations of the decision logic sections 36 and 136. Also, in the case of mutual disagreement (and possibly of similar weightings associated to each of the disagreeing sides), the decision joining program can issue a neutral output which can, in a circuit breaker configuration, then possibly lead to the breaker disabling a larger portion of the network.

The above decision joining can be generalized to three or more decision logic sections. The decision joining program can include a (possibly weighted) voting routine.

The use of more than one decision logic sections is particularly useful when different types of fault direction determining programs are used. So, for example, the second fault direction determining program can be programmed according to a machine learning-based algorithm or to a rule-based algorithm. Then, in the case of mutual agreement between the different approaches, the risk of an error is reduced and the stability is increased. Also, errors can be detected easier because even if one fault direction determining program issues an incorrect result, this error can be detected and overridden, or will at least lead only to a neutral output, and not to a more problematic incorrect output.

While the fault direction indicator device 30 (see, e.g., FIG. 1) is useful on its own, it is particularly useful when integrated into a monitoring system or a circuit breaker system (e.g., relay). For this purpose, an optional communication section of the fault direction indicator device 30 allows it to transmit the determined fault direction (e.g., the fault direction indicator indicating, for example, a forward or backward fault) to another unit of the power distribution network, for example, to a circuit breaker, to a control unit, or to a supervising unit for supervising the transmission line 10.

Figure 10:
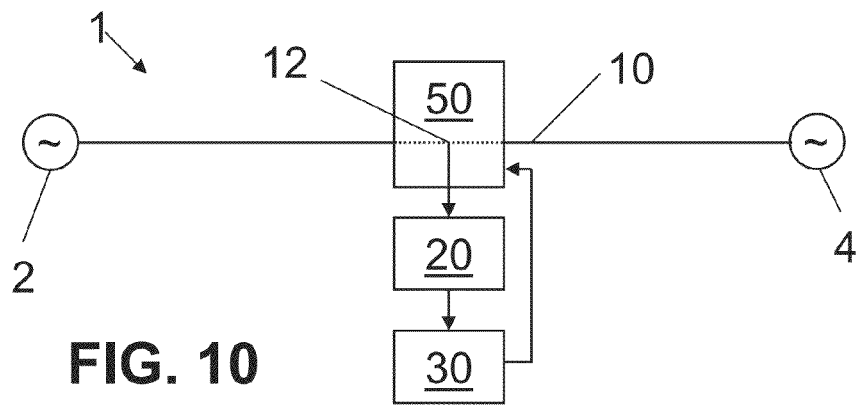
FIG. 10 shows a power distribution system, including a circuit breaker, according to an exemplary embodiment of the present disclosure.

FIG. 10 shows a configuration in which the power distribution system 1 includes a circuit breaker 50. The circuit breaker 50 is operatively coupled to the fault direction indicator device 30, possibly via a central control unit. Thereby, the circuit breaker can receive, from the fault direction indicator device 30, at least one of the first, second, and third fault direction indicator(s), or some other fault direction information obtained therefrom, such as likelihood information or a neutral output. This output can then trigger the circuit breaker 50, or the central control unit, to take appropriate action, for example, to cut the appropriate section, not the entire line 10. In the case of an "inconclusive information" output, a larger portion such as the entire line 10 can be cut.

In some exemplary embodiments, the decision logic section 36 (see, e.g., FIG. 1) additionally includes a power flow direction determining program for determining a power flow direction from the transmission line data. The monitoring of power flow can be performed in regular intervals or permanently, independently of a fault.

The additional power flow information from the power flow direction determining program can also be used for controlling the circuit breaker 50 shown in FIG. 10. Power flow from the grid 4 to the source 2 is unwanted, since energy is thereby wasted. Thus, if this unwanted power flow is detected (possibly over a predetermined time interval), circuit breaker 50 can be activated to break the appropriate section so as to limit the waste of energy.

In this case, the device 30 can be described as a hook-up power flow direction device to detect if there is unwanted power flow. This device is especially useful for distributed generation units like wind/solar power systems. These units might stop producing, and in this case the power will start flowing in opposite direction (from grid 4 to generator 2). From the point of view of the currents involved, this situation is similar to an upstream fault condition (as described above), except that there is no actual fault. Hence, the directional device could detect this kind of situation with the algorithms described herein, and activate the circuit breaker 50 or issue a warning.

In known networks, the energy delivery takes place through the transmission grid (HV) via HV transformers to the distribution grid and through distribution transformers to the LV and final users. This can also be described as a "top-down" power flow from the main power plants via the various transmission networks to the power plug in the wall. The protection scheme for the power plant and network is done accordingly. With the introduction of more distributed power generation, mainly by alternative energies, the direction of power flow can, however, change under certain environmental conditions. For example, distributed units can at some times act as power sources feeding power into the grid, and at other times consume power from the grid.

A known directional overcurrent function, referenced to the voltage phases, cannot adapt or distinguish when the flow of power (or current at a given voltage phase angle) changes direction due to more energy being generated by distributed generation units than is consumed in the grid to be protected. The known directional overcurrent function is unable to adapt to the changed situation as the changed pre-fault condition (inversed power flow) is not taken into account as the voltage phase is not changing.

By utilizing the pre-fault current as a reference for the directional information according to an exemplary embodiment of the present disclosure, under fault conditions the protection function is enabled to adapt to the changed situation, for example, the changed pre-fault power flow. Hence, the function described in the present disclosure will always protect the network by "switching off" the power source by tripping in the forward direction, because the forward direction is always defined as the direction towards the fault from the view of the current power source.

For example, consider a first case in which power flows in the normal direction from central power source to distributed units. Then, in the case of a fault, assuming the relay trips in the forward condition and blocks in the backward condition, the relay will isolate the main power source from the fault location: The relay in the forward direction to the fault trips, while the relay in the backward direction blocks. As the fault is still present, it might be that some power still gets fed to the fault, through the previously blocked relay, from a distributed unit located after the fault. In this case the current flow will change, as the distributed unit is feeding into the fault. If the current is again overstepping the setpoint, for example, trigger a trip command, the previously blocked relay will now trip as the fault is now in forward direction from that relay. This is one example of how a protection system for the currents can adapt to changed conditions and protect and isolate the source from the fault.

In a second case, the distributed units feed energy into the distributed network. In case of a fault, the relay trips in the forward direction and blocks in the backward direction. Thereby, the distributed unit gets disconnected from the fault as the pre-fault current was in the direction of the HV grid connection (towards the central power source as viewed from the grid). Also, in this example, if the fault is still present after the distributed unit is disconnected, the power direction is inversed and the HV grid is feeding into the fault. Hence, the blocking relay now sees a changed pre-fault current: Now, this relay will also see a forward current flow and will trip immediately so that the fault becomes completely isolated.

The above method can be varied in some respects. In the following, some general aspects of the disclosure will be described.

For example, while above some methods were described based on zero crossings, alternatively, some other periodically re-occurring features of the current can be used in an analogous manner. Thus, the offset indicative parameter may be extracted as follows. A first time and a second time are determined by identifying two neighboring ones of the periodically re-occurring features of the current data, such that the fault time is between the first time and the second time. The offset indicative parameter (82) is then, for example, the time interval between the first time and the second time.

Such periodically re-occurring features can be a maximum, a minimum, or a highest gradient of the current data and/or of its magnitude. Some of these features have a period of a full AC cycle, and some of a half AC cycle. This can have a consequence for the time within which the fault direction can be determined. Generally, features with a period of a half AC cycle, such as zero crossing and features based on the magnitude of the current allow for faster determining of the fault direction.

According to an exemplary embodiment, the threshold value corresponds to an offset that is less than the sampling rate phase angle.

According to an exemplary embodiment, the transmission line includes a plurality of phases, for example, three phases, and the method includes measuring the current at each of the phases, and determining respective offset indicative parameters for each of the plurality of phases separately. According to an exemplary embodiment, from the three phases, a maximum offset indicative parameters is selected. Here, the maximum refers to the absolute value. According to an exemplary embodiment, a magnitude of the current values is compared to a threshold value. In case the magnitude of a respective one of the current values is lower than the threshold value, at least some of the offset indicative parameters are discarded and/or a "neutral" command is issued.

According to an exemplary embodiment, the measuring includes measuring a current but not measuring any voltage of the transmission line. According to an exemplary embodiment, the fault direction parameter is obtained as "forward fault" or "backward fault" based on the sign of the accumulated phase difference parameter. According to an exemplary embodiment, the fault direction parameter is obtained as "neutral" if the absolute value of the offset direction parameter is less than a threshold value.

According to an exemplary, an additional method for obtaining a fault direction parameter is taken into account. The additional method includes the following: transmitting a current signal indicative of the measured current to a decision logic section, the current signal including a plurality of pre-fault current values and a plurality of post-fault current values; determining, by the decision logic section, a plurality of phase difference values indicative of respective phase differences between respective ones of the pre-fault current values and respective ones of the post-fault current values; accumulating the plurality of phase difference values into an accumulated phase difference parameter; obtaining the fault parameter by comparing the accumulated phase difference parameter to a threshold value; and outputting the determined fault parameter.

According to an exemplary embodiment, a fault direction indicator device according to the present disclosure is provided.

According to an exemplary embodiment, the fault direction indicator device includes the measurement unit, where the measurement unit includes a current sensor for measuring the current at the measurement location of the transmission line but does not include a voltage sensor. The, measurement unit is operatively coupled to the input section for transmitting the current signal obtained from the current measurement to the input section.

According to an exemplary embodiment, a directional overcurrent relay including a fault direction indicator device as described herein is provided. The relay further includes a circuit breaker operatively coupled to the fault direction indicator device for receiving, from the fault direction indicator device, the fault direction parameter, possibly in a processed form, for example, a parameter including information from the fault direction parameter.

According to an exemplary embodiment, any of the devices described herein are used in an outdoor and/or smart grid power distribution network, for example, a power distribution network with distributed units, where the grid is configured such that the distributed units can feed power into the grid during normal operation.

While the foregoing is directed to exemplary embodiments, other and further exemplary embodiments can be devised without departing from the basic scope determined by the claims.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method of determining a fault direction parameter of a fault on an AC transmission line of a power distribution system relative to a measurement location of the transmission line, the method comprising:

measuring, by a measurement unit, a time-dependent AC current of the transmission line at the measurement location to obtain time-domain current data indicative of the measured current, the measurement unit including a current sensor for measuring the current at the measurement location of the transmission line but not including a voltage sensor, wherein the measuring includes measuring a current without measuring a voltage of the transmission line;

transmitting the current data from the measurement unit to a decision logic section;

obtaining a fault time of the fault on the AC transmission line;

identifying a first time and a second time by identifying a periodically re-occurring feature of the current data, such that the fault time is between the first time and the second time, the periodically re-occurring feature being selected from the group consisting of a zero-crossing, a maximum, a minimum, and a highest gradient of the current data;

extracting, from the current data, an offset indicative parameter indicative of a time offset of the current at the fault time, the offset indicative parameter being a time interval between the first time and the second time;

calculating an offset direction parameter by comparing the offset indicative parameter to a non-offset indicative parameter; and establishing the fault direction parameter based on a sign of the calculated offset direction parameter, wherein the extracting of the offset indicative parameter includes:

choosing integral limits of a current integration time interval such that the current integration time interval is at least one of a normal period length of the AC current and an integer multiple thereof; and calculating a numerical integral of the current data over the current integration time interval.

2. The method according to claim 1, wherein the offset indicative parameter is selected from the group consisting of: a time interval including the fault time, and a numerical time integral of current data within a time interval including the fault time.

3. The method according to claim 2, comprising:

monitoring the current data to determine whether the current data contains at least two of the periodically re-occurring features at times closer to the fault time than a predetermined threshold; and ignoring at least one of the at least two determined periodically re-occurring features.

4. The method according to claim 3, wherein the extracting of the offset indicative parameter includes:

choosing integral limits of a current integration time interval such that the current integration time interval is at least one of a normal period length of the AC current and an integer multiple thereof; and calculating a numerical integral of the current data over the current integration time interval.

5. The method according to claim 4, wherein the transmission line comprises a plurality of phase lines, and wherein the method comprises:

measuring the current at each of the phase lines; and determining a respective offset indicative parameter for each of the plurality of phase lines separately.

6. The method according to claim 5, comprising:

selecting the offset indicative parameter from the phase line for which a difference between the offset indicative parameter and the non-offset indicative parameter is largest in magnitude.

7. The method according to claim 6, wherein the fault direction parameter includes a "forward fault", a "backward fault" and "neutral", and wherein the method comprises:

comparing a magnitude of a difference between the offset indicative parameter and the non-offset indicative parameter to a threshold value; and issuing a "neutral" command when case the magnitude of the difference is lower than the threshold value.

8. The method according to claim 6, wherein the fault direction parameter is a first fault direction parameter, and wherein the method comprises:

determining a second fault direction parameter from the current data by a second fault direction determining program, wherein the second fault direction determining program includes receiving a current signal including complex-number pre-fault and post-fault current values from an input section, determining a phase angle of the respective current values, determining a plurality of phase difference values between selected ones of the phase angles, summing at least some of the phase difference values to obtain an accumulated phase difference parameter, and determining the second fault direction parameter by comparing the accumulated phase difference parameter with a threshold value;

establishing a master fault direction parameter from the first fault direction parameter and from the second fault direction parameter; and outputting the master fault direction parameter.

9. The method according to claim 2, wherein the extracting of the offset indicative parameter includes:

choosing integral limits of a current integration time interval such that the current integration time interval is at least one of a normal period length of the AC current and an integer multiple thereof; and calculating a numerical integral of the current data over the current integration time interval.

10. The method according to claim 9, wherein the transmission line comprises a plurality of phase lines, and wherein the method comprises:

measuring the current at each of the phase lines; and determining a respective offset indicative parameter for each of the plurality of phase lines separately.

11. The method according to claim 10, comprising:

selecting the offset indicative parameter from the phase line for which a difference between the offset indicative parameter and the non-offset indicative parameter is largest in magnitude.

12. The method according to claim 11, wherein the fault direction parameter includes a "forward fault", a "backward fault" and "neutral", and wherein the method comprises:

comparing a magnitude of a difference between the offset indicative parameter and the non-offset indicative parameter to a threshold value; and issuing a "neutral" command when case the magnitude of the difference is lower than the threshold value.

13. The method according to claim 11, wherein the fault direction parameter is a first fault direction parameter, and
wherein the method comprises:
determining a second fault direction parameter from the current data by a second fault direction determining program, wherein the second fault direction determining program includes
receiving a current signal including complex-number pre-fault and post-fault current values from an input section,
determining a phase angle of the respective current values,
determining a plurality of phase difference values between selected ones of the phase angles,
summing at least some of the phase difference values to obtain an accumulated phase difference parameter, and
determining the second fault direction parameter by comparing the accumulated phase difference parameter with a threshold value;
establishing a master fault direction parameter from the first fault direction parameter and from the second fault direction parameter; and
outputting the master fault direction parameter.

14. The method according to claim 1, wherein the transmission line comprises a plurality of phase lines, and
wherein the method comprises:
measuring the current at each of the phase lines; and
determining a respective offset indicative parameter for each of the plurality of phase lines separately.

15. The method according to claim 14, comprising:
selecting the offset indicative parameter from the phase line for which a difference between the offset indicative parameter and the non-offset indicative parameter is largest in magnitude.

16. The method according to claim 14, wherein the measuring includes measuring a current without measuring a voltage of the transmission line.

17. The method according to claim 14, wherein the fault direction parameter includes a "forward fault", a "backward fault" and "neutral", and
wherein the method comprises:
comparing a magnitude of a difference between the offset indicative parameter and the non-offset indicative parameter to a threshold value; and
issuing a "neutral" command when case the magnitude of the difference is lower than the threshold value.

18. The method according to claim 14, wherein the fault direction parameter is a first fault direction parameter, and
wherein the method comprises:
determining a second fault direction parameter from the current data by a second fault direction determining program, wherein the second fault direction determining program includes
receiving a current signal including complex-number pre-fault and post-fault current values from an input section,
determining a phase angle of the respective current values,
determining a plurality of phase difference values between selected ones of the phase angles,
summing at least some of the phase difference values to obtain an accumulated phase difference parameter, and
determining the second fault direction parameter by comparing the accumulated phase difference parameter with a threshold value;
establishing a master fault direction parameter from the first fault direction parameter and from the second fault direction parameter; and
outputting the master fault direction parameter.

19. The method according to claim 1, wherein the transmission line comprises a plurality of phase lines, and
wherein the method comprises:
measuring the current at each of the phase lines; and
determining a respective offset indicative parameter for each of the plurality of phase lines separately.

20. The method according to claim 19, comprising:
selecting the offset indicative parameter from the phase line for which a difference between the offset indicative parameter and the non-offset indicative parameter is largest in magnitude.

21. The method according to claim 1, wherein the fault direction parameter includes a "forward fault", a "backward fault" and "neutral", and
wherein the method comprises:
comparing a magnitude of a difference between the offset indicative parameter and the non-offset indicative parameter to a threshold value; and
issuing a "neutral" command when case the magnitude of the difference is lower than the threshold value.

22. The method according to claim 1, wherein the fault direction parameter is a first fault direction parameter, and
wherein the method comprises:
determining a second fault direction parameter from the current data by a second fault direction determining program, wherein the second fault direction determining program includes
receiving a current signal including complex-number pre-fault and post-fault current values from an input section,
determining a phase angle of the respective current values,
determining a plurality of phase difference values between selected ones of the phase angles, summing at least some of the phase difference values to obtain an accumulated phase difference parameter, and
determining the second fault direction parameter by comparing the accumulated phase difference parameter with a threshold value;
establishing a master fault direction parameter from the first fault direction parameter and from the second fault direction parameter; and
outputting the master fault direction parameter.

23. A method of determining a fault direction parameter of a fault on an AC transmission line of a power distribution system relative to a measurement location of the transmission line, the method comprising:
measuring, by a measurement unit, a time-dependent AC current of the transmission line at the measurement location to obtain time-domain current data indicative of the measured current, the measurement unit including a current sensor for measuring the current at the measurement location of the transmission line but not including a voltage sensor, wherein the measuring includes measuring a current without measuring a voltage of the transmission line;
transmitting the current data from the measurement unit to a decision logic section;
obtaining a fault time of the fault on the AC transmission line;
identifying a first time and a second time by identifying a periodically re-occurring feature of the current data, such that the fault time is between the first time and the second time, the periodically re-occurring feature being selected from the group consisting of a zero-crossing, a maximum, a minimum, and a highest gradient of the current data;
extracting, from the current data, an offset indicative parameter indicative of a time offset of the current at the fault time, the offset indicative parameter being a time interval between the first time and the second time;

calculating an offset direction parameter by comparing the offset indicative parameter to a non-offset indicative parameter; and establishing the fault direction parameter based on a sign of the calculated offset direction parameter, wherein the fault direction parameter includes a "forward fault", a "backward fault" and "neutral", and wherein the method comprises:

comparing a magnitude of a difference between the offset indicative parameter and the non-offset indicative parameter to a threshold value; and issuing a "neutral" command when case the magnitude of the difference is lower than the threshold value.

24. A method of determining a fault direction parameter of a fault on an AC transmission line of a power distribution system relative to a measurement location of the transmission line, the method comprising:

measuring, by a measurement unit, a time-dependent AC current of the transmission line at the measurement location to obtain time-domain current data indicative of the measured current, the measurement unit including a current sensor for measuring the current at the measurement location of the transmission line but not including a voltage sensor, wherein the measuring includes measuring a current without measuring a voltage of the transmission line;

transmitting the current data from the measurement unit to a decision logic section;

obtaining a fault time of the fault on the AC transmission line;

identifying a first time and a second time by identifying a periodically re-occurring feature of the current data, such that the fault time is between the first time and the second time, the periodically re-occurring feature being selected from the group consisting of a zero-crossing, a maximum, a minimum, and a highest gradient of the current data;

extracting, from the current data, an offset indicative parameter indicative of a time offset of the current at the fault time, the offset indicative parameter being a time interval between the first time and the second time;

calculating an offset direction parameter by comparing the offset indicative parameter to a non-offset indicative parameter; and establishing the fault direction parameter based on a sign of the calculated offset direction parameter, wherein the fault direction parameter is a first fault direction parameter, and wherein the method comprises:

determining a second fault direction parameter from the current data by a second fault direction determining program, wherein the second fault direction determining program includes receiving a current signal including complex-number pre-fault and post-fault current values from an input section, determining a phase angle of the respective current values, determining a plurality of phase difference values between selected ones of the phase angles, summing at least some of the phase difference values to obtain an accumulated phase difference parameter, determining the second fault direction parameter by comparing the accumulated phase difference parameter with a threshold value;

establishing a master fault direction parameter from the first fault direction parameter and from the second fault direction parameter; and outputting the master fault direction parameter.

\* \* \* \* \*